United States Patent [19]

Yeh et al.

[11] Patent Number: 5,783,493
[45] Date of Patent: Jul. 21, 1998

[54] METHOD FOR REDUCING PRECIPITATE DEFECTS USING A PLASMA TREATMENT POST BPSG ETCHBACK

[75] Inventors: Rann Shyan Yeh, Taichun; Chao-Hsin Chang; Hsien-Wen Chang, both of Hsin-Chu, all of Taiwan

[73] Assignee: Taiwan Semiconductor Manufacturing Company Ltd., Hsin-Chu, Taiwan

[21] Appl. No.: 789,718

[22] Filed: Jan. 27, 1997

[51] Int. Cl.$^6$ .................................................. H01L 21/00
[52] U.S. Cl. .................... 438/718; 438/760; 438/783; 216/67; 216/74
[58] Field of Search .................... 438/694, 697, 438/698, 710, 718, 719, 723, 760, 783, 785; 216/67, 74, 76, 78, 79, 80

[56] References Cited

U.S. PATENT DOCUMENTS

| | | | |
|---|---|---|---|
| 5,000,818 | 3/1991 | Thomas et al. | 156/643 |
| 5,314,848 | 5/1994 | Yasui et al. | 437/248 |
| 5,405,489 | 4/1995 | Kim et al. | 156/643 |
| 5,512,514 | 4/1996 | Lee | 437/195 |
| 5,656,556 | 8/1997 | Yang | 438/646 |
| 5,679,591 | 10/1997 | Lin et al. | 437/43 |

*Primary Examiner*—R. Bruce Breneman
*Assistant Examiner*—Luz Alejandro
*Attorney, Agent, or Firm*—George O. Saile; Stephen B. Ackerman; William J. Stoffel

[57] ABSTRACT

The present invention provides a method of manufacturing an interlevel dielectric layer (ILD) which has reduced precipitates after an etch back of the borophosphosilicate glass (BPSG) ILD layer. A dielectric layer containing boron and phosphorous is deposited on the substrate. A reflow process is performed on the dielectric layer at a temperature in a range of between about 800° and 950° C. The dielectric layer is etched back using a reactive ion etch. In an important step, a surface treatment is performed on the dielectric layer thorough a plasma treatment. A plasma source gas for the surface treatment is of a gas selected from the group consisting of Ar, $NO_2$, $N_2$, and $O_2$, at a temperature in a range of between about 250° and 400° C. at a pressure in a range of between about 1 mtorr and 5 torr, at a RF power in a range of between about 300 and 400 watts, and for a time in a range of between about 15 and 80 seconds.

13 Claims, 2 Drawing Sheets

METHOD FOR REDUCING PRECIPITATE DEFECTS USING A PLASMA TREATMENT POST BPSG ETCHBACK

BACKGROUND OF THE INVENTION

1) Field of the Invention

This invention relates generally to the fabrication of semiconductor devices and more particularly to a plasma surface treatment applied to a substrate after an etch back of a BPSG layer.

2) Description of the Prior Art

Some very large scale integration (VLSI) processes would benefit by being performed at lower temperatures than those necessary for phosphosilicate glass (PSG) reflow (1000°–1100° C.) because such high temperatures result in excessive diffusion of junctions. Furthermore, metal oxide semiconductor gate oxide cannot be exposed to high temperature processing. However, flowable glass is still very desirable for facilitating film coverage over abrupt steps in the substrate topography. Glass flow temperatures as low as 700° C. can be obtained by adding boron dopant (e.g., $B_2UT$) to the PSG glass flow to form the ternary (three component) oxide system $B_2O_3$—$P_2O_5$—$SiO_2$, borophosphosilicate glass or BPSG.

Because of the BPSG characteristics mentioned above, atmospheric pressure chemical vapor deposition (APCVD) using $O_3$ and organic-source has been recently used. When BPSG is used as an interlayer dielectric film for submicron devices, BPSG reflow temperatures cause junction breakdown due to thermal stress. Therefore low temperature reflow processing is desirable.

According to the conventional process technology, planarization of interlayer dielectrics (LD) is accomplished by borophosphosilicate glass (BPSG) reflow for deposition. After reflow, the BPSG layer is etched back to remove a top portion of the layer.

We have found that the etchback process forms precipitates that appear as island like crystal defects. The size of these island like defects is between about 1 µm and 5 µm and defect counts per wafer range from 100 to 1000. These defects cause metal like shorts and will cause additional defects as dimensions shrink to sub-half- micron size. The precipitates also cause pattern defects or etching defects resulting from the precipitated grains and therefore lower manufacturing yields.

Others have striven to solve different particle problems on BPSG layers. For Example, U.S. Pat. No. 5,405,489 (Kim et al.) shows a method of depositing a BPSG dielectric layer, treating the BPSG layer with a plasma treatment, reflowing the BPSG layer. The plasma treatment is used to raise the boiling point of BPSG and to decrease the BPSG etch rate in $H_2SO_4$. However, Kim does not address the problem of precipitates formed on a BPSG layer after a BPSG layer etchback. U.S. Pat. No. 5,314,848 (Yasui et al.) shows a method of reflowing (heat treating) a BPSG layer to eliminate particles contamination. However, these patents do not address the problem of precipitates on a BPSG layer after a BPSG layer etch back.

SUMMARY OF THE INVENTION

It is an object of the present invention to provide a method reducing the precipitates on a BPSG layer after a BPSG layer etchback. It is an object of the present invention to provide a method of plasma surface treating a BPSG layer after an etchback to eliminate precipitates.

To accomplish the above objectives, the present invention provides a method of manufacturing an interlevel dielectric layer which has reduced precipitates after a BPSG etch back. The method begins by providing a semiconductor substrate having electrical elements thereon and therein. A dielectric layer containing boron and phosphorous is deposited over the substrate. A reflow process is preferably performed on the dielectric layer at a temperature in a range of between about 800° and 950° C. The dielectric layer is etched back using a reactive ion etch. After this etchback, the precipitates of the present invention form on the BPSG layer surface.

In an important step, a surface treatment is performed on the dielectric layer through a plasma treatment. A plasma source gas for the surface treatment can be a gas of Ar, $NO_2$, $N_2$, or $O_2$ and the treatment performed at a temperature in a range of between about 250° and 400° C., at a pressure in a range of between about 1 mtorr and 5 torr, at a RF power in a range of between about 300 and 400 watts, and for a time in a range of between about 15 and 80 seconds. This plasma treatment eliminates the precipitates from the BPSG surface.

The present invention provides a plasma treatment method of eliminating precipitates on a BPSG layer after an etch back. The plasma treatment is inexpensive and effective.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Figure 1:
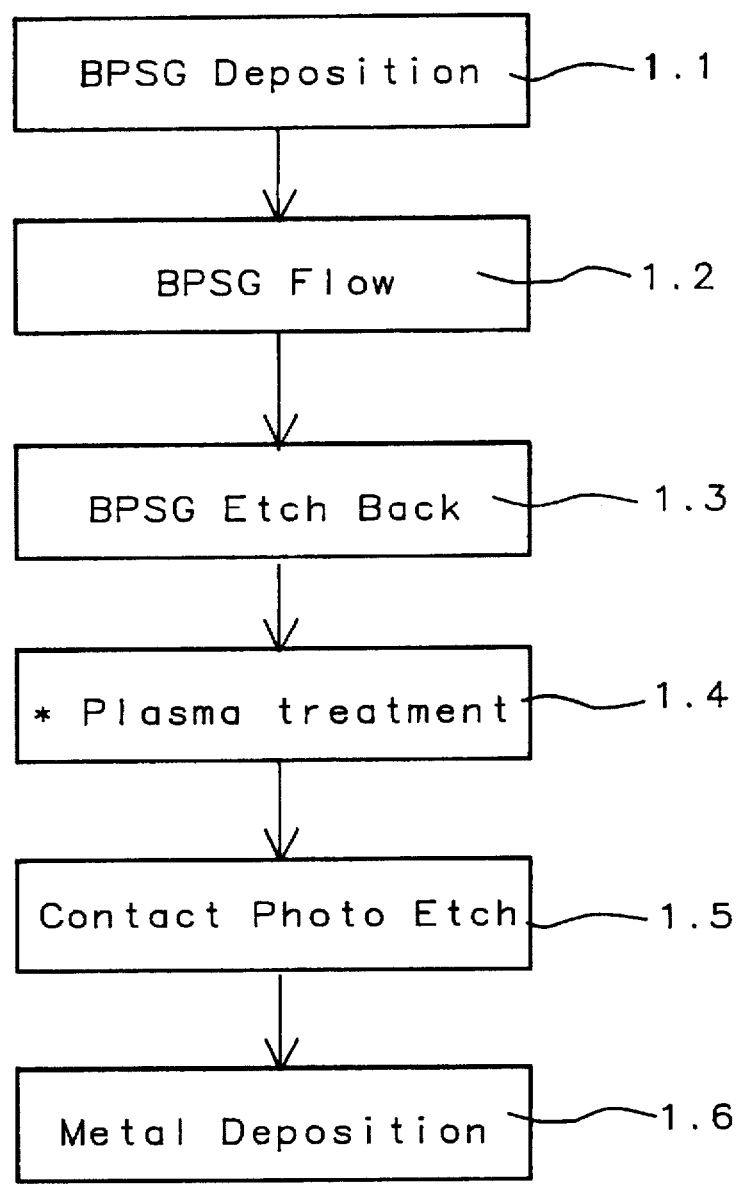
FIG. 1 is a flow chart of the process of the present invention.

The present invention will be described in detail with reference to the accompanying drawings. The present invention provides a method of reducing the precipitates on a BPSG layer after a BPSG layer etchback. The invention provides plasma surface treatment for a BPSG layer after an etchback to eliminate precipitates. A flow chart of the process of the invention is shown in FIG. 1.

Figure 2:
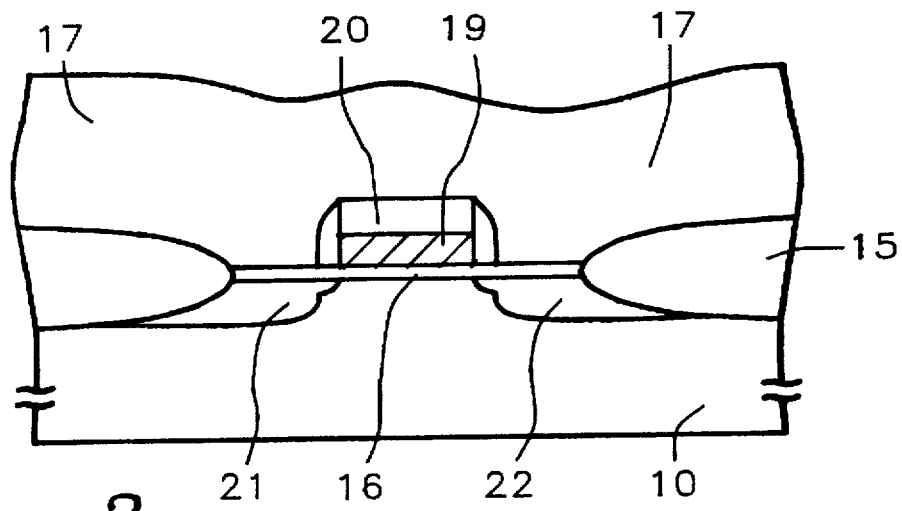
FIGS. 2 through 4 are cross sectional views for illustrating a method for manufacturing an interlevel dielectric (ILD) layer having reduced precipitates by using a plasma treatment after a BPSG layer etch back according to the present invention.

As shown in FIG. 2, a semiconductor structure (e.g., substrate) 10 is provided upon which a dielectric layer is formed. The semiconductor structure 10 (e.g., substrate) is understood to possibly include a semiconductor wafer, active and passive devices 19, 20, 21, 22, 23, and 24 formed within the wafer and layers formed on the wafer surface. These are only examples of devices formed under dielectric layers. The term "semiconductor structure" is mean to include devices formed within a semiconductor wafer and the layers overlying the wafer. The term "semiconductor structure surface" is meant to include the upper most exposed layers on a semiconductor wafer, such as a silicon surface, an insulating layer and metallurgy lines.

FIG. 2 shows a semiconductor structure (i.e., a semiconductor wafer 10 with field oxide regions 15, source/drain regions 21, and 22, gate oxide 16, and gate 19, and 20). These devices and others not shown can be formed using conventional processes.

A dielectric layer 17 containing boron and phosphorous is deposited over the semiconductor structure 10 (e.g., substrate and transistor). The dielectric layer containing boron and phosphorous (BPSG layer 17) is preferably deposited using BP-TEOS. Trimethylborate (TMB)+ Trimethylphosphate (TMOP)+SiI processes and more preferably deposited using a BP-TEOS process. The precipitate can occur with all known BPSG deposition processes after the BPSG etchback.

The BP-TEOS layer 17 ($O_3$-Tetraethylorthosilicate (TEOS) BPSG) is formed under deposition conditions as follows: TEOS flow at between about 2 and 3 SLM, Trimethylborate (TMB) at between about 0.05 and 0.07 SLM; Trimethylphosphate (TMOP) flow at between about 0.13 and 0.16 SLM; $O_3$ concentration between about (low $O_3$) 10:1 and (high $O_3$) 40:1 ($O_3$:$O_2$), $O_3$+$O_2$ flow between about 8 and 10 SLM and at a temperature between about 300° and 450° C. The dielectric layer preferably has a thickness (before etch back) in a range of between about 6000 and 9000 Å.

The dielectric layer 17 preferably contains boron at a concentration between about 3 and 6 weight %. The dielectric layer preferably contains phosphorous at a concentration between about 3 and 6 weight %. The wt % P or B affects the amount of precipitation after etch back.

A reflow process is performed on the dielectric layer at a temperature in a range of between about 800° and 950° C. for a time between about 50 and 60 minutes. The precipitates, the invention is designed to remove, are not formed during the reflow process.

Figure 3:
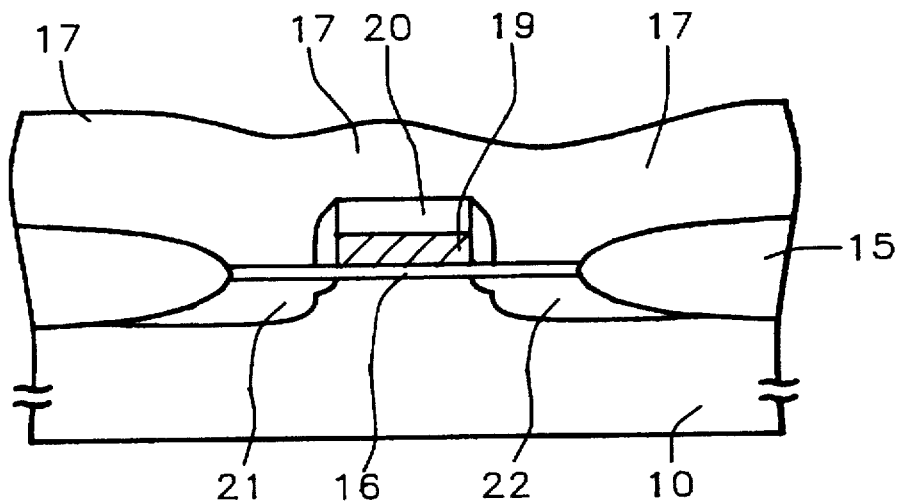

Next, the dielectric layer is etched back as shown in FIG. 3. The etch back is performed preferably using a reactive ion etch (RIE) with a fluorine gas, such as $CF_4$—$H_2$, $C_2F_6$, $C_2F_6$—$C_2H_4$, $C_3F_8$, $C_4F_8$, or $CHF_3$. The dielectric layer 17 is more preferably etched back using a reactive ion etch (RIE) etch comprising $CF_4$ and $CBF_3$.

After the etch back, the precipitates form on the BPSG surface. The etchback process forms precipitates that appear as island like crystal defects (and that have a different morphology than precipitates formed after BPSG reflow). The size of these island like defects is between about 1 µm and 5 µm and defect counts per wafer range from 100 to 1000. EDX analysis shows that the defects contain at least P, but do not appear to contain measurable amounts of B. These defects cause metal like shorts and will cause additional defects as dimensions shirk to sub-half- micron size. The precipitates also cause pattern defects or etching defects resulting from the precipitated grains and therefore lower manufacturing yields. All dry etch backs processes appear to create the precipitates, for example, RIE etch back processes produce the precipitate. The precipitates formed after the etch back of the BPSG layer differ from the precipitates discussed in the prior art.

In an important step, a surface treatment is performed on the dielectric layer thorough a plasma treatment. The plasma source for the surface treatment is preferably performed with Argon (Ar), $NO_2$, $N_2$, or $O_2$ and is most preferably performed using Ar, and at a temperature in a range of between about 250° and 400° C., and more preferably between 350° and 375° C., at a pressure in a range of between about 1 mtorr and 5 torr, and more preferably between 2 mtorr and 10 mtorr, at a RF power in a range of between about 300 and 400 watts and more preferably between about 340 and 360 Watts, and for a time in a range of between about 30 and 80 seconds and more preferably between 65 and 75 seconds. The mechanism the plasma of the present invention eliminates the precipitates is theorized to be by ion bombardment.

Figure 4:
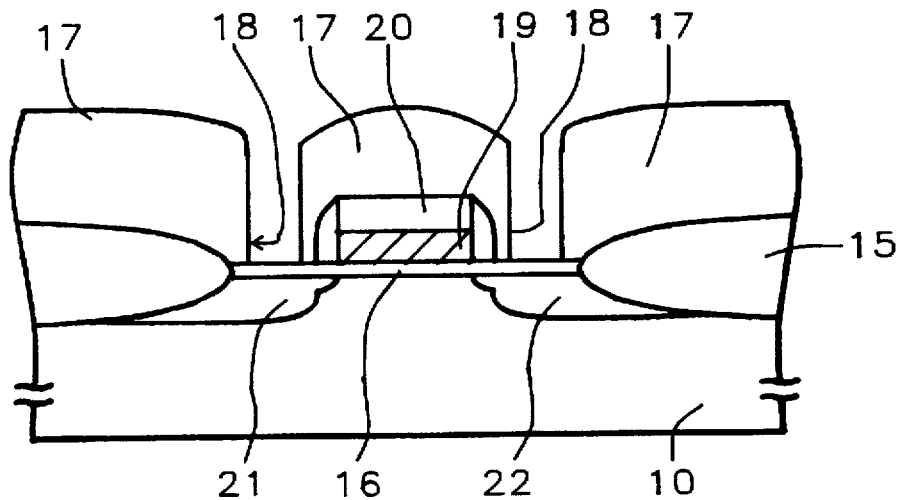

As shown in FIG. 4, the dielectric layer 17 patterned using conventional photolithographic processes forming contact openings 18. It is important that the plasma treatment is not performed after the photo patterning step (FIG. 1, 1.5) because the plasma treatment increases the contact resistance (Rc) in the contact holes to an undesirably high value, even when a contact implant is performed.

Afterwards an adhesion layer (not shown) preferably composed of Ti/TiN can be formed in the contact openings 18. This is preferably followed by a metal deposition forming a contact with the source/drain and other elements.

Experiments show that the Plasma treatment of the present invention significantly reduces the precipitate counts (per wafer) as shown in table 1 below:

TABLE 1

Precipitate Counts as a Function of Plasma treatment

| Process | Precipitate count per wafer |
| --- | --- |
| no treatment | 135 |
| $O_2$ (15 sec) | 117 |
| $N_2$ (30 sec) | 93 |
| Ar (70 sec) | 52 |

Table 1 shows the significant reduction in precipitates with the post etch back plasma treatment of the invention. The preferred plasma treatment is the Ar plasma treatment for a time in a range of between about 30 and 80 seconds and more preferably of about 70 seconds.

The present invention provides a method reducing the precipitates on a BPSG layer after an etchback of the BPSG layer. The invention provides plasma surface treatment for a BPSG layer after an etchback to eliminate precipitates. The plasma treatment is inexpensive and cost effective. The plasma treatment of the invention can be performed in the process after an etch back of a BPSG layer.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of an interlevel dielectric layer comprising:

a) preparing a semiconductor substrate having electrical element thereon and therein;

b) depositing a dielectric layer containing boron and phosphorous on said substrate;

c) performing a reflow process on said dielectric layer;

d) etching back said dielectric layer; and e) performing a surface treatment, after said etching back, on said dielectric layer through a plasma treatment, said plasma treatment uses a plasma source gas of a gas selected from a group consisting of: Ar, $NO_2$, $N_2$, and $O_2$.

2. The method of claim 1, wherein said plasma treatment uses said plasma source of Ar gas, and is performed at a temperature in a range of between 250° and 400° C., at a pressure in a range of between 1 mtorr and 5 torr, at a RF power in a range of between 300 and 400 watts, and for a time in a range of between 15 and 80 seconds.

3. The method of claim 1 which further includes patterning said dielectric layer.

4. The method of claim 1 wherein said dielectric layer is deposited using $O_3$-Tetraethylorthosilicate (TEOS) BPSG under deposition conditions as follows: TEOS flow at between 2 and 3 SLM, Trimethylborate (TMB) at between about 0.05 and 0.07 SLM; Trimethylphosphate (TMOP) at between 0.13 and 0.6 SLM; $O_3+O_2$ flow between 8 and 10 SLM and at a temperature between 300° and 450° C.

5. The method of claim 1 wherein said dielectric layer has a thickness in a range of between 6000 and 9000 Å.

6. The method of claim 1 wherein the depositing of said dielectric layer containing boron and phosphorous is performed using a BP-TEOS process.

7. The method of claim 1 wherein said dielectric layer contains boron at a concentration between 3 and 6 weight % and phosphorous at a concentration in a range of between 3 and 6 weight %.

8. The method of claim 1, wherein the reflow process on said dielectric layer is performed at a temperature in a range of between 800° and 950° C.

9. The method of claim 1 wherein step (d) further includes, forming a precipitate on said dielectric layer; said precipitate is a non-boron containing precipitate.

10. A method of fabrication of interlevel dielectric layer composed of BPSG comprising:

a) preparing a semiconductor substrate having electrical element thereon and therein;

b) depositing a dielectric layer containing boron and phosphorous on said substrate; said dielectric layer is deposited using $O_3$-Tetraethylorthosilicate (TEOS) BPSG under deposition conditions as follows: TEOS flow at between 2 and 3 SLM, Trimethylborate (TMB) at between 0.05 and 0.07 SLM; Trimethylphosphate (TMOP) at between 0.13 and 0.6 SLM; a $O_3:O_2$ ratio between about 10:1 and 40:1, a $O_3+O_2$ flow between 8 and 10 SLM and at a temperature between 300° and 450° C., said dielectric layer contains boron at a concentration between 3 and 6 weight % and phosphorous at a concentration in a range of between 3 and 6 weight %;

c) performing a reflow process on said dielectric layer at a temperature in a range of between about 800° and 900° C.;

d) etching back said dielectric layer, the etch back comprising a reactive ion etch; and forming a precipitate on said dielectric layer; said precipitate is a non-boron containing precipitate;

e) performing a surface treatment on said dielectric layer through a plasma treatment; a plasma source gas for said surface treatment is Ar, at a temperature in a range of between 350° and 400° C. at a pressure in a range of between 2 mtorr and 10 mtorr, at a RF power in a range of between 340 and 360 watts, and for a time in a range of between 65 and 75 seconds;

f) forming a contact opening through said dielectric layer;

g) forming an adhesion layer composed of Ti/TiN over said dielectric layer; and h) forming a metal contact filling said contact opening.

11. A method of fabrication of interlevel dielectric layer composed of BPSG comprising:

a) preparing a semiconductor substrate having electrical element thereon and therein;

b) depositing a dielectric layer containing boron and phosphorous on said substrate; said dielectric layer is deposited using $O_3$-Tetraethylorthosilicate (TEOS) BPSG;

c) performing a reflow process on said dielectric layer;

d) etching back said dielectric layer, the etch back comprising a reactive ion etch; and e) performing a surface treatment on said dielectric layer through a plasma treatment; a plasma source gas for said surface treatment is Ar, at a temperature in a range of between about 350° and 400° C. at a pressure in a range of between about 2 mtorr and 10 mtorr, at a RF power in a range of between about 340 and 360 watts, and for a time in a range of between about 65 and 75 seconds;

f) forming a contact opening through said dielectric layer;

g) forming an adhesion layer composed of Ti/TiN over said dielectric layer; and h) forming a metal contact filling said contact opening.

12. The method of claim 11 wherein said a dielectric layer is formed under deposition conditions as follows: TEOS flow at between about 2 and 3 SLM, Trimethylborate (TMB) at between about 0.05 and 0.07 SLM; Trimethylphosphate (TMOP) at between about 0.13 and 0.6 SLM; a $O_3:O_2$ ratio between about 10:1 and 40:1, a $O_3+O_2$ flow between 8 and 10 SLM and at a temperature between about 300° and 450° C., said dielectric layer contains boron at a concentration between about 3 and 6 weight % and phosphorous at a concentration in a range of between about 3 and 6 weight %.

13. The method of claim 11 wherein the reflow of said dielectric layer is performed at a temperature in a range of between about 800° and 900° C.

* * * * *